United States Patent
Falguier et al.

(10) Patent No.: US 11,058,036 B2
(45) Date of Patent: Jul. 6, 2021

(54) ELECTRONIC ASSEMBLY FOR A ROTARY ELECTRIC MACHINE FOR A MOTOR VEHICLE

(71) Applicant: Valeo Equipements Electriques Moteur, Créteil (FR)

(72) Inventors: Manuel Falguier, Champigny sur Marne (FR); Michel Fakes, Seclin (FR); Fabien Guerin, Chatillon (FR); Yannick Le-Meitour, Châtenay Malabry (FR); Alexis Hosni, Paris (FR)

(73) Assignee: Valeo Equipements Electriques Moteur, Creteil (FR)

( * ) Notice: Subject to any disclaimer, the term of this patent is extended or adjusted under 35 U.S.C. 154(b) by 0 days.

(21) Appl. No.: 14/631,652

(22) Filed: Feb. 25, 2015

(65) Prior Publication Data
US 2015/0245542 A1 Aug. 27, 2015

(30) Foreign Application Priority Data

Feb. 26, 2014 (FR) ........................................ 1451518

(51) Int. Cl.
*H05K 7/20* (2006.01)
*H02K 5/18* (2006.01)
(Continued)

(52) U.S. Cl.
CPC .......... *H05K 7/20909* (2013.01); *H02K 5/18* (2013.01); *H02K 5/20* (2013.01); *H02K 11/02* (2013.01);
(Continued)

(58) Field of Classification Search
CPC ............... H05K 7/20909; H05K 7/209; H05K 7/20127; H05K 7/20409; H05K 7/20509;
(Continued)

(56) References Cited

U.S. PATENT DOCUMENTS 5,624,003 A * 4/1997 Matsuki ............. B60H 1/00278
   180/65.1
6,734,587 B2 * 5/2004 Hirsou ....................... H02K 5/15
   310/52
(Continued)

FOREIGN PATENT DOCUMENTS

CN 1703818 A 11/2005
CN 101919322 A 12/2010
(Continued)

OTHER PUBLICATIONS

Preliminary Search Report issued in corresponding French Patent Application 1451518 dated Dec. 17, 2014 (10 pages).
(Continued)

*Primary Examiner* — James Wu
*Assistant Examiner* — Christopher L Augustin
(74) *Attorney, Agent, or Firm* — Osha Bergman Watanabe & Burton LLP (57) ABSTRACT

An electronic assembly for a rotary electric machine for a motor vehicle is disclosed. The electronic assembly includes electronic component blocks having different thermal dissipation needs, the blocks including a power block and a control block. The assembly also includes a device for cooling the blocks and having a protective cover suitable for covering the power and control blocks. The protective cover includes a first set of openings configured to be positioned opposite a first cooling element coupled to the power block, and opposite the control block, the first cooling element being a first dissipator provided with a base plate, the base plate protruding with respect to the power block to create a first radial flow of cooling air (F1) for the power block and a second radial flow of cooling air (F2) for the control block.

13 Claims, 7 Drawing Sheets

(51) Int. Cl.
*H02K 5/20* (2006.01)
*H02K 11/02* (2016.01)
*H02K 11/33* (2016.01)
*H02K 11/04* (2016.01)
*H02K 9/06* (2006.01)

(52) U.S. Cl.
CPC .............. *H02K 11/33* (2016.01); *H02K 9/06* (2013.01); *H02K 11/048* (2013.01)

(58) Field of Classification Search
CPC .......... H02K 11/33; H02K 5/18; H02K 11/02; H02K 5/20; H02K 9/06; H02K 11/048
See application file for complete search history.

(56) References Cited

U.S. PATENT DOCUMENTS

| | | | | |
|---|---|---|---|---|
| 6,812,604 B2* | 11/2004 | Braun | .................. | H02K 11/046 310/52 |
| 7,019,424 B2* | 3/2006 | Aeschlimann | ....... | H02K 11/046 310/52 |
| 7,196,439 B2* | 3/2007 | Pierret | ..................... | H02K 9/20 310/58 |
| 7,378,766 B2* | 5/2008 | Vasilescu | ............ | F28D 15/0233 310/58 |
| 7,414,339 B2* | 8/2008 | Kitamura | ................ | H02K 9/06 310/58 |
| 7,723,875 B2* | 5/2010 | Fakes | ........................ | H02K 5/20 310/58 |
| 7,751,194 B2* | 7/2010 | Sakamoto | .......... | H05K 7/20009 165/185 |
| 7,819,172 B2* | 10/2010 | Otsuka | ................ | B60H 1/00428 165/80.3 |
| 8,169,784 B2* | 5/2012 | Sakamoto | ............. | H01L 25/162 361/729 |
| 8,662,225 B2* | 3/2014 | Masfarud | ............... | B60L 11/005 180/68.5 |
| 8,717,761 B2* | 5/2014 | Aoki | ........................ | B60K 1/04 165/104.33 |
| 8,763,740 B2* | 7/2014 | Marcath | ................... | B60K 1/04 180/68.2 |
| 9,667,116 B2* | 5/2017 | Fujimoto | ............... | H02K 1/185 |
| 10,285,286 B2* | 5/2019 | Asao | ..................... | H05K 7/1432 |
| 10,320,247 B2* | 6/2019 | Horii | ...................... | H02K 1/20 |
| 2003/0098621 A1* | 5/2003 | Fisher | ..................... | H02K 11/23 310/89 |
| 2004/0100808 A1 | 5/2004 | Braun et al. | | |
| 2007/0069593 A1* | 3/2007 | Vasilescu | ................ | F28D 15/04 310/54 |
| 2007/0295568 A1* | 12/2007 | Vasilescu | ................ | H02K 9/06 188/267 |
| 2008/0197727 A1 | 8/2008 | Dubuc et al. | | |
| 2008/0204998 A1* | 8/2008 | Matsui | .................... | H05K 1/189 361/695 |
| 2009/0034309 A1* | 2/2009 | Ibori | ...................... | H02M 7/003 363/141 |
| 2013/0027887 A1 | 1/2013 | Osato et al. | | |
| 2013/0320786 A1* | 12/2013 | Isoda | ................... | H02K 11/215 310/59 |
| 2013/0334934 A1* | 12/2013 | Maeda | ................... | H02K 11/33 310/68 B |
| 2014/0097715 A1* | 4/2014 | Hall | ......................... | H02K 5/18 310/59 |
| 2014/0265664 A1* | 9/2014 | Camilleri | ............... | H02K 11/33 310/59 |
| 2015/0042187 A1* | 2/2015 | Bradfield | ............. | H02K 11/046 310/59 |
| 2015/0303772 A1* | 10/2015 | Le Goff | ................ | F04D 19/002 415/116 |
| 2016/0373035 A1* | 12/2016 | Yong | ..................... | H02K 11/28 |

FOREIGN PATENT DOCUMENTS

| | | |
|---|---|---|
| CN | 102573412 A | 7/2012 |
| DE | 102008007825 A1 | 8/2009 |
| DE | 102010044439 A1 | 3/2012 |
| EP | 1722463 A1 | 11/2006 |
| EP | 2557676 A1 | 2/2013 |
| FR | 2827437 A1 | 1/2003 |
| FR | 2847085 A1 | 5/2004 |
| FR | 2923098 A1 | 5/2009 |
| JP | 2005-253184 A | 9/2005 |
| JP | 2008-543263 A | 11/2008 |
| JP | 2012-165643 A | 8/2012 |
| WO | 2009/063774 A1 | 5/2009 |
| WO | WO-2009063774 A1 * | 5/2009 ............... B61F 3/04 |

OTHER PUBLICATIONS

French Patent Application No. 1358616 (50 pages).
First Search issued in corresponding Chinese Patent Application No. 201510233897.7, dated Mar. 20, 2018 (1 page).
Office Action in corresponding Chinese Application No. 201510233897.7, dated Dec. 12, 2018 (6 pages).
Notice of Reasons for Rejection in corresponding Japanese Application No. 2015-034956, dated Dec. 9, 2019 (12 pages).

* cited by examiner

ELECTRONIC ASSEMBLY FOR A ROTARY ELECTRIC MACHINE FOR A MOTOR VEHICLE

TECHNICAL FIELD OF THE INVENTION

The present invention relates to an electronic assembly for a rotary electric machine for a motor vehicle.

The invention can be applied particularly but not exclusively in the field of motor vehicle starter alternators, for example for starter alternators or motor/generators suitable for use with vehicles of the mild hybrid type.

TECHNICAL BACKGROUND OF THE INVENTION

In a motor vehicle comprising a heat engine and a rotary electric machine such as a starter alternator, such a machine comprises, in a non-limiting manner:
 a rotor comprising an inductor in which an excitation current is conducted; and
 a stator comprising a multi-phase winding.

The starter alternator operates in motor mode or in generator mode.

This machine is referred to as being reversible.

In alternator mode, also referred to as generator mode, the machine makes it possible to transform a rotary movement of the rotor driven by the heat engine of the vehicle into an electric current induced in the phases of the stator. In this case a bridge rectifier connected to the phases of the stator makes it possible to rectify the induced sinusoidal current into a continuous current in order to supply consumers of the vehicle as well as a battery.

By contrast, in motor mode the electric machine acts as an electric motor making it possible to drive in rotation the heat engine of the vehicle via the rotor shaft. It makes it possible to transform the electrical energy into mechanical energy. In this case a converter makes it possible to transform a continuous current originating from the battery into an alternating current in order to supply the phases of the stator in order to turn the rotor.

Control components are used in order to determine the operating mode of the rotary electric machine (motor mode or generator mode) via control signals.

The starter alternators that integrate a regenerative braking function and a function of heat engine assistance under acceleration, referred to as mild hybrid starter alternators, also integrate filtering components that prevent the power components from interfering with the electrical network of the motor vehicle, generally a network of 48 volts. These reversible machines have powers of approximately 8 to 15 kW.

The power components (bridge rectifier and converter), the control components and also the filtering components generate heat. It is thus necessary to use a cooling device in order to dissipate this heat emitted by all these components.

Patent FR2847085 describes an electronic assembly comprising the power components and the control components (referred to as control units), the two sets of components being placed as close as possible to one another, and a cooling device for cooling this assembly. The cooling device comprises:
 a dissipator on which the power and control components are mounted, the dissipator being arranged on the rear bearing of the electric machine and comprising fins on its lower face, which faces the bearing. In addition, there is a free space between the rotation shaft of the rotor and the dissipator, through which space air can circulate;
 the rear bearing comprising radial air outlet holes; and
 a protective cover comprising openings arranged on the top of said cover.

Thus, some of the air is sucked laterally into the starter alternator and flows towards the radial outlet holes of the bearing, sweeping over the fins of the dissipator, and the remaining air is sucked through the openings in the cover and then flows axially along the rotation shaft (via the free space) of the rotor so as to rejoin a flow path below the dissipator. Thus, the assembly of power and control components is cooled.

One disadvantage of this prior art lies in the fact that the cooling is not optimized with respect to the individual dissipation needs of the power and control components.

In this context, the present applicant has filed French patent application number 1358616 relating to an electronic assembly comprising a power block, a filtering block, a control block and a protective cover block, comprising:
 a first set of openings positioned opposite a first cooling element coupled to the power block,
 a second set of openings positioned opposite the control block;
 a separation wall between the two sets of openings so as to create a first flow of cooling air for the power block and a second flow of cooling air for the control block.

In this context, the object of the present invention is to overcome the above-mentioned disadvantage and to present an alternative to the application filed by the applicant.

GENERAL DESCRIPTION OF THE INVENTION

To this end, the invention proposes an electronic assembly for a rotary electric machine for a motor vehicle, wherein said electronic assembly comprises:
 electronic component blocks, the blocks having different thermal dissipation needs, the blocks being:
  a power block;
  a filtering block;
  a control block;
 a device for cooling said blocks, said cooling device comprising:
  a protective cover suitable for covering the power, filtering and control blocks, said protective cover comprising a first set of openings that can be positioned opposite fins of a first cooling element coupled to the power block, and opposite the control block; and
  the first cooling element, which is a first dissipator provided with a base plate and a plurality of fins, said base plate protruding with respect to the power block so as to create a first radial flow of cooling air for said power block and a second radial flow of cooling air for said control block.

Thus, the electronic assembly comprises a structure and a cooling device that makes it possible to provide cooling adapted to the thermal dissipation needs of each block of components (power, control, filtering) thanks to the creation of a specific airflow for cooling each block, moreover without having to provide either a separation wall or two sets of openings in the protective cover in order to create the two radial airflows.

In accordance with non-limiting embodiments the electronic assembly may also comprise one or more additional features selected from the following.

In accordance with a non-limiting embodiment the cooling device also comprises a second cooling element, which is a second dissipator provided with a plurality of fins and coupled to capacitors of said filtering block.

In accordance with a non-limiting embodiment the protective cover also comprises a second set of openings that can be positioned opposite fins of the second dissipator so as to create a third radial flow of cooling air for said filtering block.

In accordance with a non-limiting embodiment the fins of the first dissipator are arranged in groups of parallel fins and the groups are arranged so as to allow a radial circulation of a flow of cooling air below the power block.

In accordance with a non-limiting embodiment the power bloc and the filtering block are electrically connected by means of a conductive element of negative polarity.

In accordance with a non-limiting embodiment the first dissipator and the second dissipator comprise mounting orifices suitable for cooperation with one another.

In accordance with a non-limiting embodiment the assembly between the power bloc and the filtering block requires a mounting screw, the conductive element, a thermal insulator arranged between a mounting tab of the first dissipator and a lower face of said conductive element, a first electric insulator arranged between said conductive element and a rear bearing of the rotary electric machine, and a second electric insulator arranged between a head of the mounting screw and an upper face of a mounting tab of the second dissipator.

In accordance with a non-limiting embodiment the cooling device also comprises a third cooling element, which is a third dissipator provided with a plurality of fins and coupled to the control block.

In accordance with a non-limiting embodiment the third dissipator is coupled to components of the control block by means of a resin, a metal strip, a gap filler or a gap pad.

In accordance with a non-limiting embodiment the openings of the first set of openings in the protective cover are lateral and are arranged in line with the fins of the first dissipator.

In accordance with a non-limiting embodiment the protective cover also comprises a third set of openings that are arranged on the top of said cover and that can be positioned above capacitors of the filtering block so as to create a fourth axial flow of cooling air for the filtering block.

The invention also relates to an electronic assembly for a rotary electric machine for a motor vehicle, wherein said electronic assembly comprises:

electronic component blocks, the blocks having different thermal dissipation needs, the blocks comprising a power block, a control block;

a device for cooling said blocks, said cooling device comprising a protective cover suitable for covering the power and control blocks, said protective cover comprising a first set of openings configured to be positioned opposite a first cooling element coupled to the power block, and opposite the control block;

the first cooling element being a first dissipator provided with a base plate, said base plate protruding with respect to the power block so as to create a first radial flow of cooling air for said power block and a second radial flow of cooling air for said control block.

The electronic assembly according to this invention can comprise any one of the features described above and that are compatible. Notably, the electronic assembly can comprise one or many of the following features:

the openings of the first set of openings in the protective cover are lateral and are arranged in line with the first dissipator, notably in line with fins of the dirst dissipater;

the electronic assembly has a filtering block, said cover being suitable for covering the filtering block;

the cooling device also comprises a second cooling element, which is a second dissipator coupled to capacitors of said filtering block;

the protective cover also comprises a second set of openings that can be positioned opposite the second dissipator so as to produce a third radial flow of cooling air for said filtering block;

the power block and the filtering block are electrically connected by means of a conductive element, notably of negative polarity;

the first dissipator and the second dissipator comprise, respectively, mounting orifices suitable for cooperation with one another;

the assembly between the power block and the filtering block requires a mounting screw, said conductive element, a thermal insulator arranged between a mounting tab of the first dissipator and a lower face of said conductive element, a first electric insulator arranged between said conductive element and a rear bearing of the rotary electric machine, and a second electric insulator arranged between a head of the mounting screw and an upper face of a mounting tab of the second dissipator;

the protective cover also comprises a third set of openings that are arranged on the top of said cover configured to be positioned above capacitors of the filtering block so as to create a fourth axial flow of cooling air for the filtering block;

the cooling device also comprises a third cooling element, which is a third dissipator coupled to the control block;

the third dissipator is coupled to components of the control block by means of a resin, a metal strip, a gap filler or a gap pad;

the or the plurality of dissipators are provided with a plurality of fins;

the fins of the first dissipator are arranged in parallel groups of fins and the groups are arranged so as to allow a radial circulation of a flow of cooling air below the power block;

the openings of the first set of openings or of the second set of openings are respectively configured to be positioned opposite the fins of the first cooling element or of the second cooling element.

BRIEF DESCRIPTION OF THE FIGURES

The invention and different applications thereof will be better understood upon reading the following description and examining the accompanying figures.

FIG. 3b shows a view from below of the filtering block of FIG. 3a;

DESCRIPTION OF EMBODIMENTS OF THE INVENTION

Elements that are identical, either by structure or by function, appearing in different figures will keep the same reference signs, unless specified otherwise.

The electronic assembly 10 for a rotary electric machine will be described with reference to FIGS. 1 to 10.

The rotary electric machine, in a non-limiting example, is a starter alternator for use in a vehicle of the mild hybrid type. The rotary electric machine in this type of application is used not only for electric generation and starting of the heat engine (with "stop & go" or "stop/start" functionality), but also for regenerative braking, traction at low speed of the vehicle, and torque assistance of the heat engine.

Figure 1:
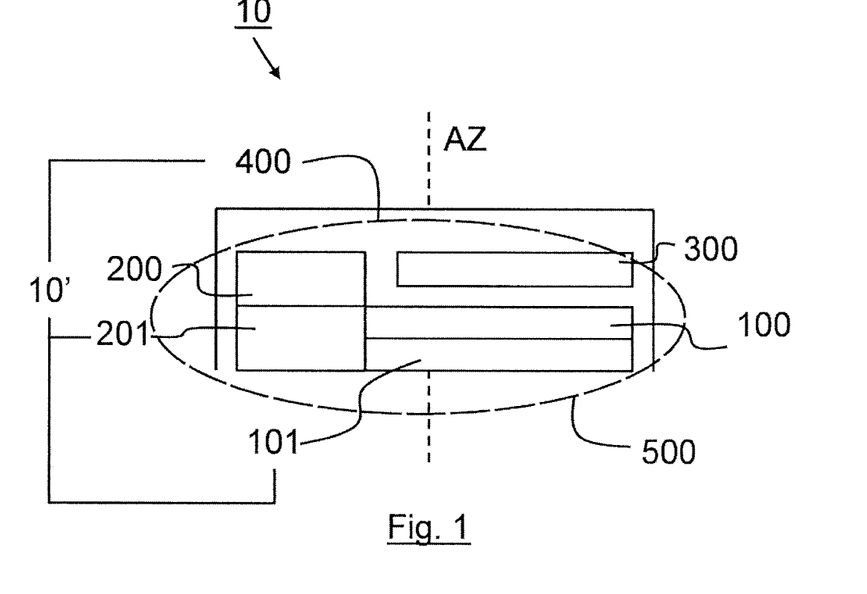
FIG. 1 shows a schematic view of an electronic assembly for a rotary electric machine for a motor vehicle according to the invention.

As illustrated schematically in FIG. 1, in accordance with a non-limiting embodiment, the electronic assembly 10 comprises:
- electronic component blocks 100, 200, 300, the blocks having different thermal dissipation needs, the blocks being:
  - a power block 100;
  - a filtering block 200;
  - a control block 300;
- a device 10' for cooling said blocks 100, 200, 300, said cooling device 10' comprising:
  - a protective cover 400 suitable for covering the power, filtering and control blocks 100, 200, 300, said protective cover comprising a first set of openings 401 that can be positioned opposite fins of a first cooling element 101 coupled to the power block 100, and opposite the control block 300; and
  - the first cooling element 101, which is a first dissipator 101 provided with a base plate 1016 and a plurality of fins 1011, said base plate 1016 protruding with respect to the power block 100 so as to create a first radial flow of cooling air F1 for said power block 100 and a second radial flow of cooling air F2 for said control block 300.

The expression "base plate 1016 protruding with respect to the power block 100" means a base plate that has an extension j with respect to said block 100, the extension j being greater than zero.

As will be seen in detail hereinafter, thanks to the structure of the electronic assembly in separate blocks, the structure of the base plate of the first dissipator that allows the creation of different airflows in order to cool the different blocks, and also the coupling between the cooling elements at the openings in the cover (the cooling elements cooperate thermally with the openings in the cover), a thermal decoupling is obtained between the different blocks and the cooling of each block is optimized. Targeted cooling is obtained for each block, each block having different operating temperatures and thus having different thermal dissipation needs. An improved cooling of the electronic assembly is thus obtained.

The different elements of the power electronic assembly and cooling device 10' thereof as well as the different airflows generated will be described in greater detail hereinafter.

Power Block

In this non-limiting example the power block 100 comprises three power modules 1001 and an excitation module 1002.

Figure 2A:
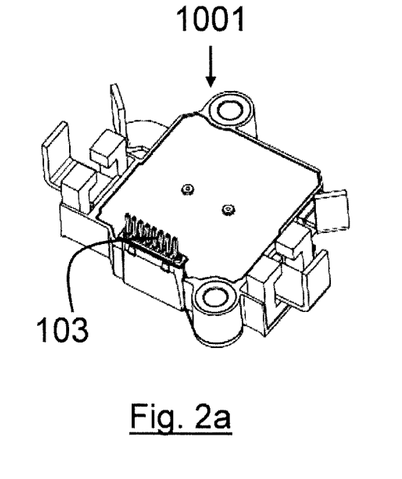
FIG. 2a shows a perspective view of a power module of a power block of the electronic assembly of FIG. 1.
Figure 2B:
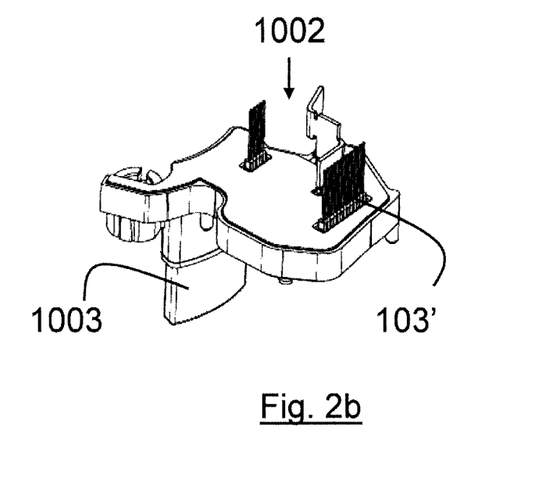
FIG. 2b shows a perspective view of an excitation module of a power block of the electronic assembly of FIG. 1.

The power modules 1001, as illustrated in a non-limiting embodiment in FIG. 2*a*, comprise electronic switches, such as MOSFET transistors by way of non-limiting example, the switches of a module being intended to provide a bridge rectifier/converter branch for a phase of the rotary electric machine. The excitation module 1002, as illustrated in a non-limiting embodiment in FIG. 2*b*, makes it possible to supply the coil of the rotor of said machine, said module conventionally comprising MOSFET transistors and diodes making it possible to determine the current in the rotor.

Since the power modules 1001 and the excitation module 1002 are sources of heat, it is necessary to cool these modules.

To this end, the cooling device 10' comprises a first cooling element, which is a first dissipator 101 (also referred to as a power block dissipator) provided with a plurality of fins and coupled to the power block 100. Said fins in a non-limiting embodiment are arranged substantially parallel below the power block 100. They are typically made of aluminium.

These fins provide a large surface area for exchange with the air passing through the electronic assembly.

Thus, as will be seen hereinafter, the cooling of the block 100 will be optimized thanks to the fins of the dissipator 101.

In addition to the power modules 1001 and excitation module 1002, the power block 100 comprises conductive tracks, which allow the passage of current in the components. These conductive tracks are also sources of heat and must be cooled.

It should be noted that the first dissipator 101 also comprises:
- a plurality of mounting tabs, said tabs making it possible to fix the control block 300. These mounting tabs serve as spacers between the two blocks 100 and 300. The control block 300 is thus arranged in a plane parallel to that of the power block 100. In a non-limiting example, four tabs are used.
- at least two mounting tabs provided with orifices, these tabs making it possible to fix the filtering block 200. In a non-limiting example two mounting tabs are used. The filtering block is described hereinafter.
- a plurality of mounting orifices, said orifices making it possible to fix the power block 100. In a non-limiting example four orifices are used.

Filtering Block

Figure 3A:
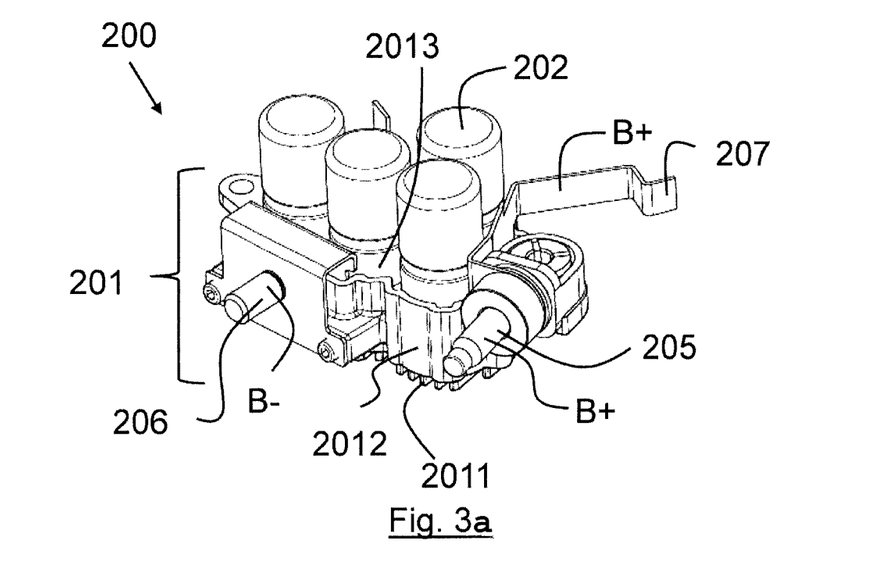
FIG. 3a shows a perspective view of a filtering block of the electronic assembly of FIG. 1.
Figure 3B:
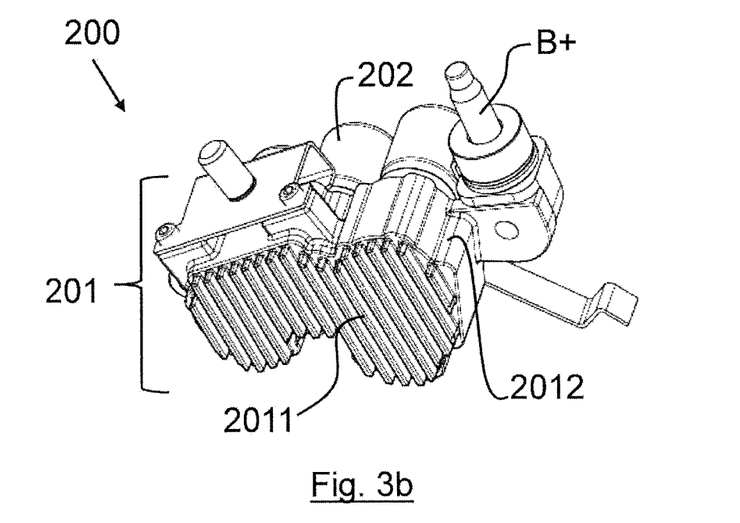

The filtering block 200 is illustrated in FIGS. 3a and 3b.

As illustrated, the filtering block 200 comprises a plurality of capacitors 202 intended to filter the interference originating from the power components (power modules 1001 in particular).

In order to cool the capacitors 202 the cooling device 10' comprises a second cooling element, which is a second dissipator 201 (also referred to as a filtering block dissipator) provided with a plurality of fins 2011, said dissipator being coupled to the capacitors 202.

These fins provide a large surface area for exchange with the air passing through the electronic assembly.

Thus, as will be seen hereinafter, the cooling of the block 200 and thus of the capacitors 202 will be optimized thanks to the fins of the dissipator 201.

It should be noted that the second dissipator 201 comprises a seat 2012 (illustrated in FIG. 4) in which the capacitors 202 are received.

In a non-limiting embodiment the second dissipator 201 is coupled to the capacitors 202 of the filtering block 200 by means of a resin 2013. Thus, the resin makes it possible not only to hold said capacitors 202 in the dissipator, but also to have good evacuation of the calories of the capacitors towards said dissipator 201.

In this embodiment in which the machine is a machine of the starter alternator type operating under a continuous voltage of 48 volts, voltage potentials B+ and B− are present in the machine and correspond respectively to +48 volts and to 0 volts of the 48 volts. It should be noted here that B− (0 V) and the general ground potential M− of the vehicle are electrically insulated in the machine, this being a general ground that is conventionally connected to the negative electrical terminal of the battery or batteries of the vehicle and also to the body of said vehicle and that is also connected in the machine to the rear bearing thereof, on which the electronic assembly 10 is fixed. Electrical insulation is thus provided between the electronic assembly, of which the electric ground is at B−, and the rear bearing connected to M−. Of course, an electrical connection can be established between B− and M− in the electric circuit of the vehicle, but in this embodiment this is not provided in the machine.

With reference to FIG. 3a or 3b, B+ is connected to the electric circuit of the vehicle via an electrical terminal 205 insulated from B−. B− is connected to the electrical circuit of the vehicle via an electrical terminal 206 electrically connected to the metal parts (in particular dissipators) of the power block 100 and of the filtering block 200 and the ground of the control block 300. An electrical connection tongue 207 is also shown in FIGS. 3a and 3b, and this tongue 207 ensures the interconnection of B+ between the filtering block 200 and the power block 100.

The power block 100 and the filtering block 200 thus both comprise conductive tracks of positive and negative polarity connected respectively to the potentials B+ and B−. These conductive tracks enable the passage of current through the electronic components of the different blocks 100, 200.

At the power block 100, the first dissipator 101 is connected to the ground B−.

As will be seen hereinafter, thanks to the combination 500 (or group or sub-assembly) shown in FIG. 1 between two blocks of electronic components having different thermal dissipation needs, said blocks being the power block 100 and the filtering block 200, and with the aid in particular of thermal and electrical insulation means and a single conductive element, an electrical connection of B− between the power block 100 and the filtering block 200 is obtained alongside electrical insulation of said B− with respect to the M− of the rear bearing, as well as a strong thermal resistance, which makes it possible to obtain good thermal decoupling between the power block 100 and the filtering block 200.

Figure 4:
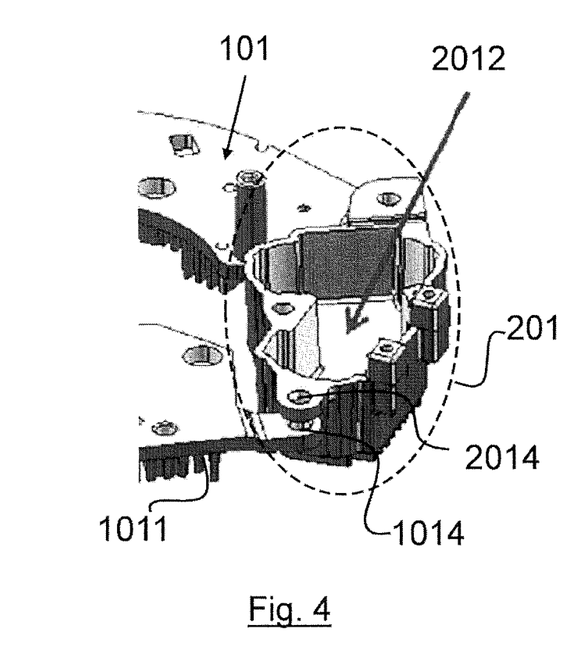
FIG. 4 shows a non-limiting embodiment of assembly of the filtering block of FIGS. 3*a* and 3*b* with a first power dissipator, without the capacitors.
Figure 5:
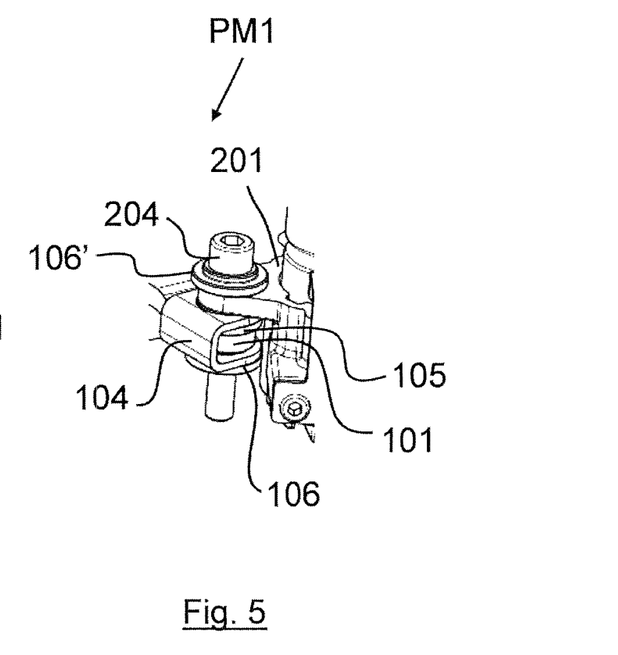
FIG. 5 shows an enlarged view of part of the assembly of FIG. 4 with assembly elements.

The combination 500 (or group or sub-assembly) is illustrated in FIG. 1, and the electrical, thermal and mechanical connections of such a combination 500 are illustrated in FIGS. 4 and 5 in particular. In FIGS. 4 and 5 the power block 100 has not been shown in order to provide greater clarity.

Thus, in a non-limiting embodiment, the electrical, thermal and mechanical assembly of the combination 500, between the blocks 100 and 200, and the mounting thereof on the rear bearing of the machine are ensured at two mounting points. At a first mounting point PM1 shown in FIG. 5, this assembly is provided by means of:
- a mounting screw 204;
- an electrically conductive element 104 at potential B−, a first end 1040 of which is in direct contact, via an upper face, with a mounting tab of the filtering block 200, on a lower face of said tab of the block 200, and a second end 1041 of which is in direct contact, via an upper face, with a mounting tab of the power block 100, on a lower face of said tab of the block 100, said tabs of the block 200 and of the block 100 being formed by extensions of the dissipators 201 and 101 respectively;
- a thermal insulator 105 arranged between:
  - said tab of the block 100, which is an extension of the first cooling element 101, which is the first dissipator 101 provided with a plurality of fins 1011 and coupled to said power block 100; and
  - a lower face of said conductive element 104;
- a first electrical insulator 106 arranged between said conductive element 104 and the rear bearing of the rotary electric machine; and
- a second electrical insulator 106' arranged between a head of the mounting screw 204 and an upper face of said tab of the filtering block 200.

The functions of the conductive element 104, of the thermal insulator 105 and of the electrical insulators 106 and 106' will be explained below.

In order to connect the power block 100 and the filtering block 200 to the same potential B− in a first non-limiting embodiment, the conductive element 104 is used as illustrated in FIG. 5. In a non-limiting embodiment said conductive element is a busbar of U-shape in general.

It is pointed out that a busbar is a shaped plate of copper or aluminium. In a non-limiting embodiment it may comprise an additional tinning so as to prevent oxidation of the copper.

This busbar 104 is arranged between the dissipator of the power block 101 and the dissipator of the filtering block 201, as illustrated in FIG. 5, so as to create a junction between the two blocks 101 and 201. The busbar thus acts as an electrical conductor and has a negative polarity B− by the direct contact thereof with the tabs of the blocks 100 and 200.

As illustrated in FIG. 4, the first dissipator 101 and the second dissipator 201 comprise respectively mounting tabs provided with mounting orifices 1014, 2014 suitable for cooperation with one another.

As illustrated in FIG. 4, the second dissipator 201 comprises mounting orifices 2014 that are disposed opposite above-described mounting orifices 1014 of the first dissipator 101, and the mounting screws 204 are inserted into these mounting orifices 1014, 2014 and are screwed on the rear bearing, thus ensuring a mechanical fixing of the electronic assembly 10 on the rear bearing of the machine.

This embodiment utilizing the busbar 104 and the thermal insulator 105 makes it possible to minimize the thermal exchanges compared with a another mode in which the two dissipators 101 and 201 would be placed in direct contact by the metal conductive parts thereof. In fact, in the described embodiment, the metal conductive part of the busbar is dimensioned in order to obtain the desired electrical resistance for the electrical conduction, which leads to a small section and small contact surfaces, thus allowing a minimization of the thermal conduction between the dissipators 101 and 201, knowing that the thermal and electrical conduction between the dissipators 101 and 201 can be provided only through the busbar 104 due to the presence of the thermal (and electrical) insulator 105. The thermal resistance between the dissipators 101 and 201 is thus increased, which reduces the thermal exchanges and allows good thermal decoupling between the power block 100 and the filtering block 200, the two blocks 100 and 200 operating in different temperature ranges.

It should be noted that, due to the presence of capacitors 202, the filtering block 200 must not reach excessively high temperatures (above 150° C. by way of non-limiting example), otherwise the capacitors 202 could be subject to deterioration. The power block 100 for its part can exceed 150° C. due to the presence of MOSFET switches, which release a lot of heat. It is thus necessary to carry out a thermal decoupling between the filtering block 200 and the power block 100 whilst allowing the passage of current between the two blocks.

The electrical insulators 106 and 106' allow the electrical insulation between the dissipators 101 and 201 at B− and the rear bearing at M− of the rotary electric machine 10, knowing that the mounting screw 204 screws into the metal part of the rear bearing of the machine. The electrical insulators 106 and 106' prevent any contact between the mounting screw 204 and the dissipators 101, 201 and busbar 104.

In a non-limiting example the insulator 105 is a washer made of a plastic of low thermal conductivity, and the insulators 106 and 106' are washers made of a plastic of low electrical conductivity. These washers are illustrated in FIG. 5.

It should be noted that the orifices 1014, 2014 in the mounting tabs must have a diameter that is sufficiently large compared to that of the mounting screw 204 in order to avoid any contact thereof with the inner walls of the orifices 1014, 2014 and to allow the insertion of a surrounding collar (not shown) of the insulating washers 106, 106' into the space between the circular edges/inner walls of the orifices 1014, 2014 and the surface of the shank of the mounting screw 204, this surrounding collar guaranteeing the impossibility of such contact. These means make it possible to obtain the desired mounting with electrical insulation between the metal parts of the dissipators 101/201 and the rear bearing of the machine.

A second mounting point (not illustrated) at the insulated electrical terminal 205 is used for the electrical, thermal and mechanical assembly of the combination 500 between the blocks 100 and 200 and for the mounting thereof on the rear bearing of the machine. Since the means used are substantially the same as those used at the first mounting point PM1, these will not be detailed here.

Control Block

Figure 6:
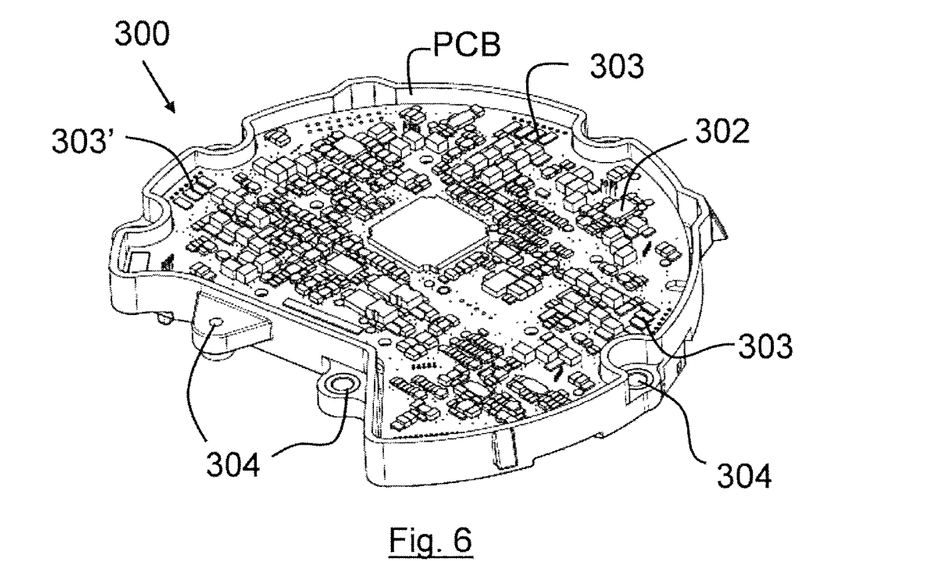
FIG. 6 shows a perspective view of a control block of the electronic assembly of FIG. 1.
Figure 7:
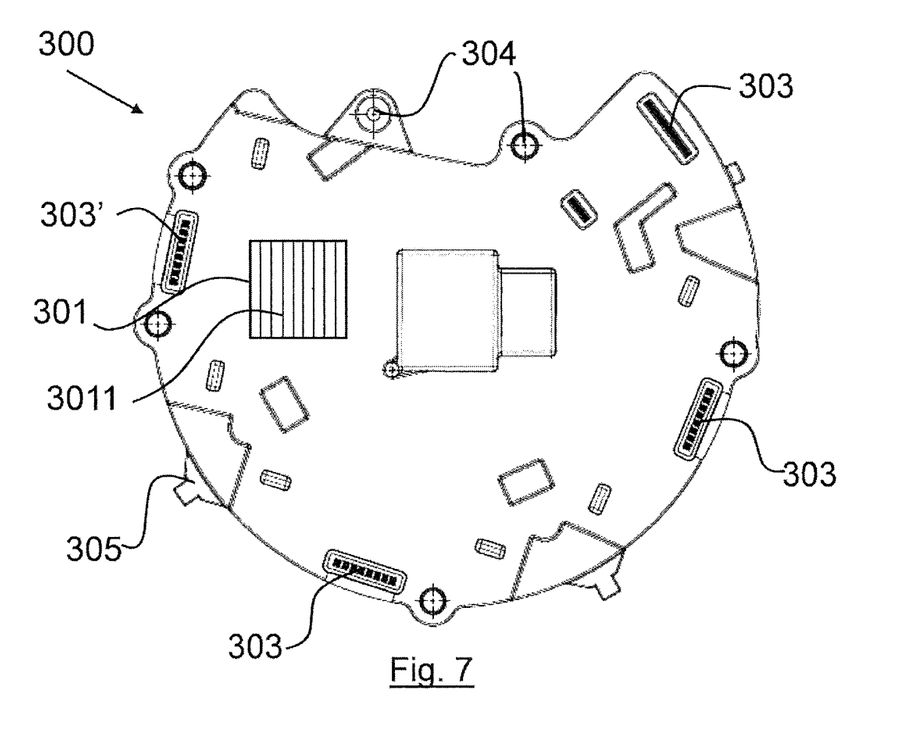
FIG. 7 shows a view from below of the control block of FIG. 6.

The control block is illustrated in FIGS. 6 and 7.

As illustrated in the perspective view, the control block 300 comprises components 302 for controlling the rotary electric machine and in particular the setting of the machine by controlling the power modules 1001 of the power block 100. Since the components 302 are known to a person skilled in the art, they are not described in the following description.

The control block is composed of a printed circuit board (PCB) on which the control components 302 are mounted.

The control block 300 is thermally separate from the power block 100.

Thus, the control function of the power modules is not located therein. To this end, in a non-limiting embodiment, the control block 300 is arranged in a first plane parallel to a second plane in which the power block 100 is mounted so as to allow a passage of a flow of cooling air F2 between the two blocks 100, 300. Thus, by creating a space between the two blocks 100 and 300, this makes it possible to guide the air between the two blocks. The assembly is thus cooled as a whole whilst creating a thermal decoupling between the two blocks. The creation of this flow of air will be explained in the description below.

In a non-limiting example the control block 300 is mounted above the power block 100 by means of mounting orifices 304 coupled to the mounting tabs (not referenced) of the first dissipator 101, which serve as spacers as seen before.

In order to communicate therebetween, the power block 100 and the control block 300 are connected to one another by means of interconnection pins. These interconnection pins are inserted respectively in spaces provided in the control block. Since each pin has a small section, the possibility of thermal exchange between the two blocks is minimized.

It should be noted that the power modules 1001 comprise a first set of interconnection pins, which are signal pins.

In addition, the excitation model 1002 comprises interconnection pins that make it possible to send measurement signals and control signals. Thus, said interconnection pins make it possible to control the excitation current of the rotor and to control said current, to send sensor signals in order to control the position of the rotor, and to raise the temperature of the machine, etc.

It will also be noted that, during operation thereof, some components of the PCB will heat up and cause the temperature of the PCB to rise. Also, in order to cool this PCB, the cooling device 10' in a non-limiting embodiment comprises a third cooling element, which is a third dissipator 301 illustrated in FIG. 6 (also referred to as the control block dissipator) provided with a plurality of fins 3011 and coupled to the control block 300.

Thus, by inserting a dissipator in the PCB housing, more precisely on the lower face of the PCB, it is possible to also use the same flow of cooling air F2 that allows the thermal decoupling between the control block 300 and the power block 100 in order to extract the calories introduced by the components of the PCB.

In non-limiting examples the third dissipator 301 is coupled to components of the control block 300 by means of a resin, a metal strip, a gap filler or a gap pad.

Protective Cover

As will be seen hereinafter, the flows of cooling air suitable for each different thermal dissipation block are generated and oriented on the different blocks by means of a protective cover and the base plate 1016 of the first dissipator 101. Some of these flows of air will thus sweep over the fins of different dissipators coupled to the different blocks and thus optimize the cooling of said blocks, said fins increasing the surface area of dissipation of components that heat up.

Figure 8:
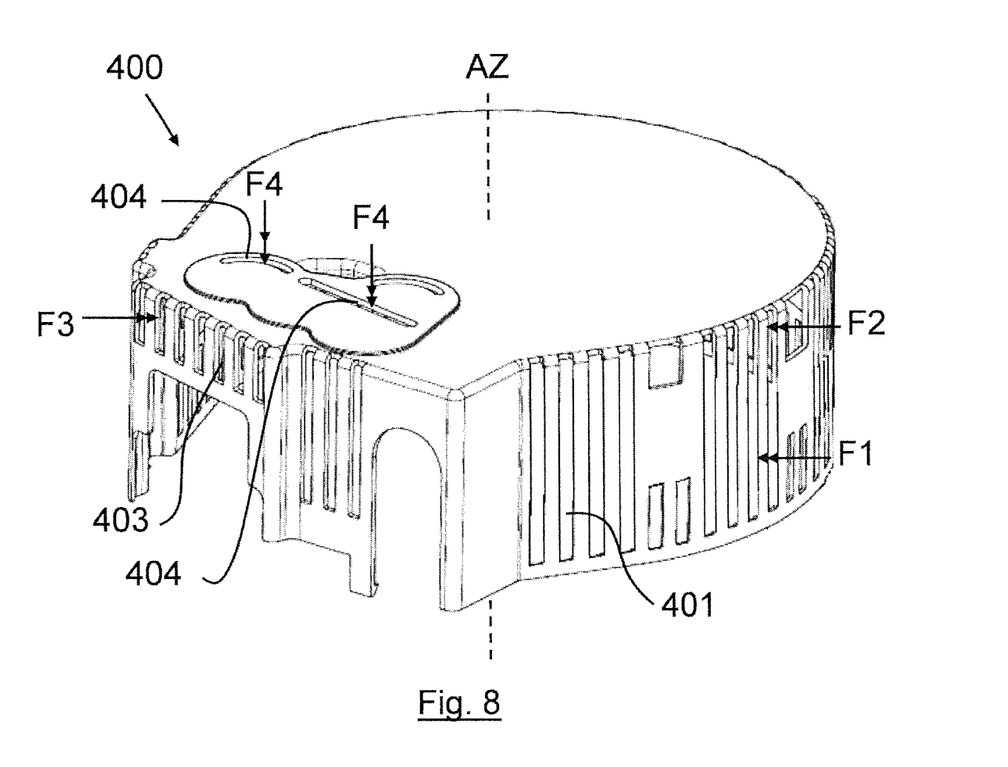
FIG. 8 shows a perspective view of a protective cover of the electronic assembly of FIG. 1.

The protective cover 400 is illustrated in FIG. 8.

As illustrated, the protective cover 400 comprises openings that are divided into:
- a first set of openings 401 that can be positioned opposite fins of the first dissipator 101 and also opposite the control block 300; and
- a second set of openings 403 that can be positioned opposite fins of the second dissipator 201 so as to create a third flow of cooling air F3 for said filtering block 200.

The fan of the electric machine sucks in air in order to cool the machine. This air is sucked in laterally via the openings 401, 403 of the protective cover and then flows towards and through said openings. On the basis of this sucked-in air, due to the presence of two types of openings 401 and 403, different flows of air are created respectively (F1 and F2 for the first set of openings 401, and F3 for the second set of openings 403).

First Set of Openings 401

The first set of openings 401 coupled to the first dissipator 101 allows the passage of a first flow of air F1 and of a second flow of air F2.

The first flow of air F1 is sucked in by the fan towards the base. It sweeps over the lower surface of the power block 100 (via the first dissipator 101). As can be seen in the explanatory diagrams in FIGS. 9*a* and 9*b*, the first flow of air F1 will flow radially through the first set of openings 401 and will sweep over the dissipator elements, that is to say the fins 1011 of the first dissipator 101 over the entire length, before exiting axially towards the electric machine 1, that is to say along the axis AZ of the rotor. The power block 100 is thus cooled by means of the cooling of the first dissipator 101 via the fins.

The second flow of air F2 flows also through the first set of openings 401 and radially beneath the lower surface of the control block 300, before exiting axially along the axis AZ. The control block 300 is thus cooled.

The extension j of the base plate 1016 that protrudes with respect to the power block 100 prevents the two flows of air F1 and F2 from mixing.

In a first non-limiting embodiment illustrated in FIG. 9*a*, the fins 1011 of the first dissipator 101 are located below the power block 100 and do not protrude with respect to set block 100. There are no fins 1011 along the extension j.

Figure 9A:
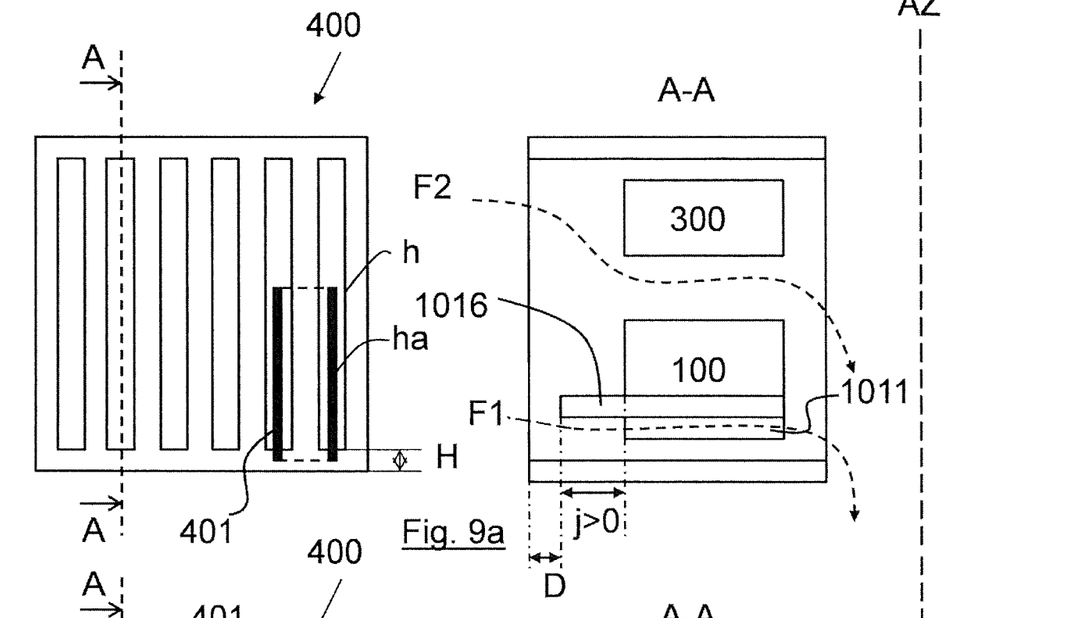
FIG. 9*a* is a diagram explaining the airflows generated by lateral openings in the protective cover of FIG. 8 coupled with a first dissipator in accordance with a first non-limiting embodiment.
Figure 9B:
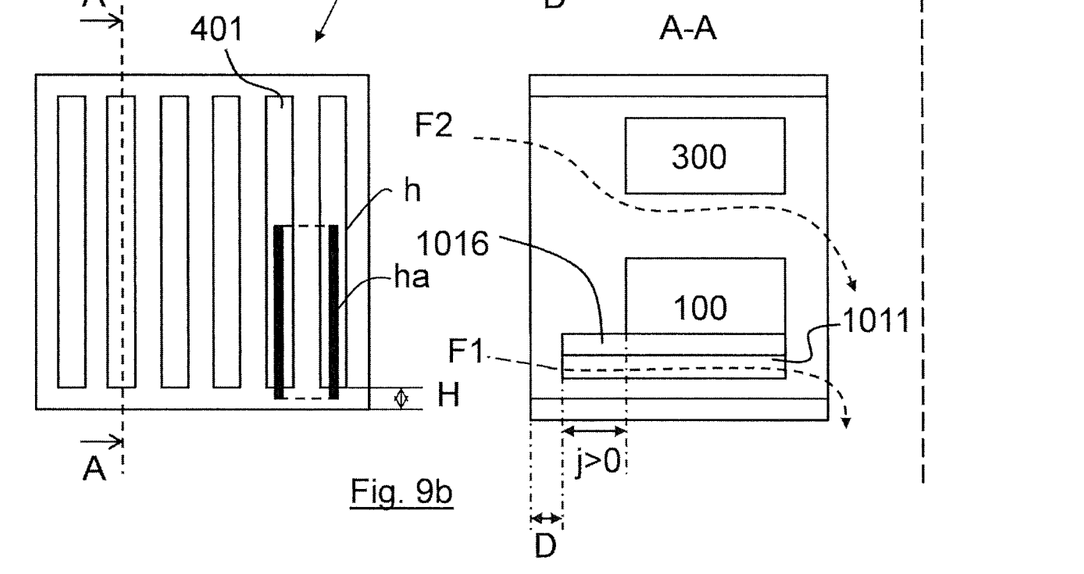
FIG. 9*b* is a diagram explaining the airflows generated by lateral openings in the protective cover of FIG. 8 coupled with a first dissipator in accordance with a second non-limiting embodiment.

In a second non-limiting embodiment illustrated in FIG. 9*b*, the fins 1011 of the first dissipator 101 protrude with respect to said block 100. They are thus distributed below the power block 100, but also along the extension j of the dissipator 101.

It should be noted that the extension j of the base plate 1016 is to be adapted in accordance with the cover/dissipator arrangement of the assembly and in accordance with the operating point that it is desired to favour. The greater the speed of rotation increases, the less becomes the importance of the extension j.

The extension j is thus of benefit for slow speeds of rotation, where the loss of load imposed by the fan is low and therefore where the reduction of flow section at the fins (local load losses) is important.

A good thermal decoupling between the two blocks 100 and 300 is obtained by this separation of the flow of cooling air into a first flow F1 and a second flow F2 having different flow paths.

It should be noted that in the non-limiting embodiment in which the third dissipator 301 is present, the cooling of the components of the control block 300 by the flow of air F2 is optimized because said flow F2 will sweep over the fins of said third dissipator. The extraction of calories introduced by some components of the PCB housing that heat up is thus improved.

In a non-limiting embodiment the openings of the first set of openings 401 in the protective cover 400 are lateral and are arranged in the same direction as the fins of the first dissipator 101. Thus, since the openings in the protective cover are arranged in the same direction as the fins of the first dissipator 101, that is to say vertically here, the flow of air that passes through the openings and that will sweep over the fins is greater than if the openings were in a different direction.

Thus, the extension j of the base plate 1016 of the first dissipator 101 with respect to the power block 100 makes it possible to obtain two flows of air for cooling, respectively, the power block 100 and the control block 300. A single set of openings 401 over the height of the protective cover 400 (on the side) is necessary. The extension of the base plate of the power dissipator 101 thus makes it possible to separate the flows of air dedicated to the power dissipator (fins) and to the thermal decoupling between the electronic power unit 100 and electronic control unit 300.

In order to optimize the coupling between openings in the cover/fins of the first dissipator 101, it is necessary for these openings to be correctly positioned with respect to fins of the first dissipator 101.

Figure 10:
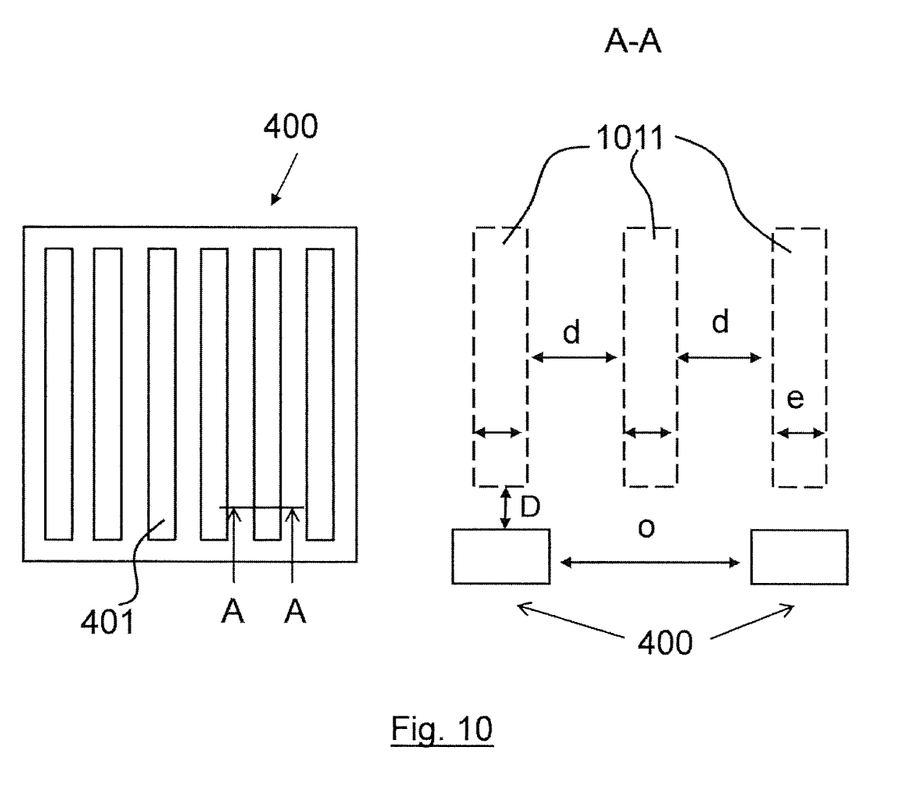
FIG. 10 is a diagram explaining the openings in the protective cover of FIG. 9*a* or FIG. 9*b* that are arranged opposite fins of a first dissipator.

With reference more particularly to FIGS. 9*a*, 9*b* and 10, the fins of the first dissipator 101, the protective cover 400 and the openings of the first set of openings 401 are arranged so as to satisfy the following relationships:

$$h \geq 0.5 \cdot ha \quad (1)$$

$$H < 0.5 \cdot ha, \text{ and} \quad (2)$$

$$D \geq 0.5 \cdot (d^2 - ((o-e)/2)^2)^{1/2} \quad (3)$$

where h is the height of the cover opening, ha is the height of the fin, H is the distance between the base of the cover and the base of the opening, D is the distance between the lower edge of the cover and the edge of attack of the fin, d is an inter-fin space separating two adjacent fins, o is the width of a cover opening and e is the thickness of a fin.

The relationships (1) to (3) above have been determined by the applicant by means of tests and allow good cooling on the basis of the fact that the best compromise possible is obtained.

Second Set of Openings 403

In a non-limiting embodiment the protective cover 400 also comprises a second set of openings 403, as illustrated in FIG. 8, which makes it possible to generate the third flow of air F3. This flow of air will flow radially through the second set of openings 403 and will sweep over the dissipator elements, that is to say the fins of the second dissipator 201 over the entire length, before exiting axially towards the electric machine, that is to say along the axis AZ of the rotor.

In a non-limiting embodiment the openings of the second set of openings 403 are lateral and are arranged in the same direction as the fins of the second dissipator 201.

Thus, since these openings in the protective cover are arranged in the same direction as the fins of the second dissipator 201, that is to say vertically here, the flow of air that passes through the openings and that will sweep over the fins is more significant than if the openings were in a different direction.

This thus makes it possible to obtain good cooling of the filtering block 200 and consequently of the capacitors 202.

Third Set of Openings 404

In a non-limiting embodiment the protective cover 400 also comprises a third set of openings 404 that are arranged on the top of said cover 400 (as illustrated in FIG. 8) and that can be positioned above capacitors 202 of the filtering block 200 so as to create a fourth flow of cooling air F4 for the filtering block 200.

As illustrated, this fourth flow F4 will flow axially through the third set of openings 404, that is to say parallel to the axis AZ of the rotor, and will sweep over the capacitors 202, but also the vertical walls 2012, before exiting towards the electric machine.

An axial flow of air also cooling the filtering capacitors 202 is thus created.

Thus, the filtering block 201 receives a radial flow of air F3 and an axial flow of air F4, which makes it possible to obtain optimal cooling (composed of two flows of air) over the fins. Thanks to this optimization of thermal exchange, the capacitors are thus cooled well.

It should be noted that another function of the protective cover 400 is to protect the electronic assembly against mechanical attacks, such as the intrusion of a screw or of a mechanical tool for example, etc. The openings 401, 403 and also 404 must also be dimensioned so as to avoid such mechanical attacks and so as to observe a maximum width determined in accordance with the desired protection against said attacks. The value of this width is thus dictated by the degree of protection desired for the starter alternator against the penetration of foreign bodies, in particular solids (also referred to as IP protection).

Thus, the electronic assembly 10 described above makes it possible to operate the starter alternator. The latter comprises:
 a rotor;
 a stator coupled to said rotor and comprising a plurality of phases;
 an electronic assembly 10 in accordance with any one of the above features, the power block 100 of said electronic assembly 10 being suitable for connection to the phases of said stator;
 a rear bearing supporting said stator; and
 a fan arranged in the proximity of the rear bearing.

Of course, the description of the invention is not limited to the application, to the embodiments, or to the examples described above.

Thus, the present invention applies to any type of reversible multi-phase rotary electric machines, such as starter alternators, driven for example by belt or integrated, and in particular for hybrid applications.

Thus, in another non-limiting exemplary application, the starter alternator is full hybrid and makes it possible to drive the motor vehicle by means of the electric motor alone (generally during start-up), or by means of the heat engine alone (generally when the speed rises), or by the engine and electric motor at the same time (for example in order to obtain stronger acceleration). The barrier that supplies the electric motor recovers energy by regenerative braking.

Thus, the invention described in particular has the following advantages:

It allows thermal decoupling between the control block and the power block thanks to:
 the mechanical assembly thereof: the two blocks are arranged in two parallel planes with a space allowing the passage of a flow of air, and
 the electrical assembly thereof: the two blocks are connected via the interconnection pins, which minimize the possibility of thermal exchange between the two blocks, the thermal exchange surface being very reduced;
 the second flow of air passing between the control block and the power block.

The invention allows thermal decoupling between the power block and the filtering block thanks to:
 the thermal insulation of the second dissipator and the first dissipator via the insulating washers;
 the electrical assembly thereof: the two blocks are connected via a single busbar, which minimizes the possibility of thermal exchange between the two blocks, the conductive mass being reduced.

The invention allows an optimization of the cooling of the components of the electrical assembly thanks to:
 the structure in separate operational blocks (power block, filtering block, control block), the blocks having different operating temperatures (medium and maximum) as well as different dissipation needs;
 the creation of flows of air dedicated to each operational block via the particular structure of the base plate of the first dissipator (the extension j) and the structure of the protective cover of the cooling device (the openings for orienting the entry of air into the electronic assembly opposite the power block and the control block, the shape and positioning of these openings with respect to the cooling fins of the first and second dissipators);
 the coupling of the cooling elements of the cooling device, that is to say different dissipators, with different operational blocks, the fins of said dissipators making it possible to increase the surface area for exchange with air in order to evacuate the calories;
 the passage of a radial flow of air and of an axial flow of air in order to avoid an overheating of the capacitors and thus prevent damage thereto;
 the resin, which allows good evacuation of the calories of the capacitors towards the second dissipator.

In addition, the invention allows a simplification of the manufacture of the protective cover by providing only a single set of radial openings on the side of said cover.

The invention claimed is:

1. An electronic assembly for a rotary electric machine of a motor vehicle, said electronic assembly comprising:
 electronic component blocks having different thermal dissipation needs, the electronic component blocks comprising a power block and a control block, wherein the control block controls the power block; and
 a cooling device that cools said electronic component blocks and comprises a protective cover for covering the power and control blocks,
 said protective cover comprising a first set of openings that is positioned opposite to a first cooling element coupled to the power block and opposite the control block,
 the first cooling element being a first dissipator provided with a base plate having a plurality of fins, said base plate being extended with respect to the power block to allow a first radial flow of cooling air, flowing radially through the first set of openings, to sweep over said plurality of fins for said power block before exiting axially through the protective cover toward the electric machine, and a second radial flow of cooling air flowing in a gap between said control block and said power block, for said control block, wherein the second radial flow of cooling air flows radially beneath a lower surface of the control block and above an upper surface of the power block.

2. The electronic assembly according to claim 1, wherein openings of the first set of openings in the protective cover are lateral and are arranged in line with the first dissipator.

3. The electronic assembly according to claim 1, further comprising a filtering block, said protective cover also covering the filtering block.

4. The electronic assembly according to claim 3, wherein the cooling device further comprises a second cooling element, which is a second dissipator coupled to capacitors of said filtering block.

5. The electronic assembly according to claim 4, wherein the protective cover further comprises a second set of openings that is positioned opposite the second dissipator to produce a third radial flow of cooling air for said filtering block.

6. The electronic assembly according to claim 3, wherein the power block and the filtering block are electrically connected using a conductive element.

7. The electronic assembly according to claim 4, wherein the first dissipator and the second dissipator comprise, respectively, mounting orifices that cooperate with one another.

8. The electronic assembly according to claim 6, wherein the assembly between the power block and the filtering block requires:
a mounting screw,
said conductive element,
a thermal insulator arranged between a mounting tab of the first dissipator and a lower face of said conductive element,
a first electric insulator arranged between said conductive element and a rear bearing of the rotary electric machine, and
a second electric insulator arranged between a head of the mounting screw and an upper face of a mounting tab of the second dissipator.

9. The electronic assembly according to claim 1, wherein the protective cover further includes a third set of openings that are arranged on the top of said cover that is positioned above capacitors of the filtering block to create a fourth axial flow of cooling air for the filtering block.

10. The electronic assembly according to claim 1, wherein the cooling device further comprises a third cooling element, which is a third dissipator coupled to the control block.

11. The electronic assembly according to claim 10, wherein the third dissipator is coupled to components of the control block by one selected from a group consisting of a resin, a metal strip, a gap filler and a gap pad.

12. The electronic assembly according to claim 1, wherein the plurality of fins of the first dissipator are arranged in parallel groups of fins and the groups are arranged to allow a radial circulation of a flow of cooling air below the power block.

13. The electronic assembly according to claim 1, wherein the openings of the first set of openings or of the second set of openings are respectively positioned opposite the fins of the first cooling element or of the second cooling element.

* * * * *